United States Patent [19]

Fukuchi

[11] Patent Number: 5,574,400
[45] Date of Patent: Nov. 12, 1996

[54] FEEDFORWARD AMPLIFIER WITH REDUCED DISTORTION IN WIDE BAND

[75] Inventor: Akio Fukuchi, Tokyo, Japan

[73] Assignee: NEC Corporation, Japan

[21] Appl. No.: 413,085

[22] Filed: Mar. 29, 1995

[30]     Foreign Application Priority Data

Mar. 31, 1994  [JP]  Japan .................................. 6-062573

[51] Int. Cl.⁶ ..................................................... H03F 1/32
[52] U.S. Cl. .............................................. 330/52; 330/151
[58] Field of Search ............................... 330/52, 149, 151

[56]            References Cited

U.S. PATENT DOCUMENTS 4,412,185  10/1983  Gerard .............................. 330/151 X
4,595,882   6/1986  Silagi et al. ........................... 330/151
5,166,634  11/1992  Narahashi et al. ..................... 330/151

OTHER PUBLICATIONS

Japanese Patent Laid–Open Hei–1–198809, Aug. 10, 1989.

Primary Examiner—James B. Mullins
Attorney, Agent, or Firm—Laff, Whitesel, Conte & Saret, Ltd.

[57]            ABSTRACT

A first pilot signal is superimposed onto an input signal thereto to distribute the signal as a first signal and a second signal to two destinations. The first signal is fed via an equalizer to a main amplifier for amplification thereof such that a second pilot signal is mixed with the amplified signal to attain a main amplification signal. Subtraction is conducted between the second signal and the main amplification signal to extract a distortion signal to be fed via an equalizer to an auxiliary amplifier so as to produce an auxiliary amplification signal. Between the main and auxiliary amplification signals, there is effected subtraction to attain a differential signal. The pilot signals are detected according to the differential and output signals. The equalizers are controlled to set the pilot signals to a minimum value. Consequently, there is achieved a linear amplifier obtaining a stable amplification signal with reduced distortion in a wide band.

6 Claims, 5 Drawing Sheets

5,574,400

FEEDFORWARD AMPLIFIER WITH REDUCED DISTORTION IN WIDE BAND

BACKGROUND OF THE INVENTION

1. Field of the Invention

The present invention relates to a feedforward amplifier and, in particular, to a feedforward amplifier for detecting and suppressing distortion in an output signal amplified by a feedforward loop.

2. Description of the Prior Art

As a linear amplifier employed to simultaneously amplify many frequencies in a high-frequency band, there has been known a feedforward amplifier described in the Japanese Patent Laid-Open Hei-1-198809. FIG. 1 shows an example of structure of the conventional feedforward amplifier. The configuration includes a distortion sensing loop A and a distortion removing loop B such that an input signal containing multiple frequencies received from an input terminal 101 is amplified at a time by a main amplifier 104. The sensor loop A cancels inputted signal components to achieve amplification thereof so as to detect non-linear distortion components caused by the amplification. The remover loop B amplifies the detected distortion components by an auxiliary amplifier 115 and adds the resultant signal to an output signal from the main amplifier 104, thereby cancelling the distortion components.

The distortion sensor loop A includes a pilot oscillator 118, a (directional) coupler 119 for superimposing a pilot signal onto an input signal, a two-output distributor 102, a vector adjuster 103 for adjusting attenuation and phase shift, a main amplifier 104, a delay line 106, a coupler 110, a detector (DET) 122, and a control circuit 109. Additionally, couplers 107 and 108 are arranged as shared components for the sensor loop A and remover loop B. The coupler 108 produces an output signal, which is fed via the coupler 110 to the detector 122 to be detected therein. The detected signal is applied to the control circuit 109. The controller 109 supervises the vector adjuster 103 to set the output level of the detector 122 to a minimum value.

Furthermore, the distortion remover loop B includes the couplers 107 and 108, which are also used by the distortion sensor loop A, a pilot oscillator 120, a coupler, a delay line 111, a coupler 112, a vector adjuster 113 for regulating attenuation and phase shift, an auxiliary amplifier 115, a coupler 116, a detector (DET) 123, and a control circuit 114.

In the output circuit of the feedforward circuit, the control circuit 114 detects the pilot signal via the coupler 116 and detector 123 to control the vector adjuster 113 so as to set the sense level of the pilot signal to a minimum value.

Description will now be given of operation of the conventional linear (feedforward) amplifier constructed as above. A multiplex signal containing many frequencies in a high-frequency band is received via the input terminal 101 to be superimposed by the coupler 119 onto the output signal from the pilot oscillator 118. The obtained signal is distributed by the distributor 102 as a first signal and a second signal.

The first signal is fed to the vector adjuster 103. Attenuation and phase shift thereof are regulated by the adjuster 108. The resultant signal is delivered to and amplified by the main amplifier 104 to be coupled by the coupler 121 with the pilot signal generated from the pilot oscillator 120. The obtained signal is fed via the coupler 107 and delay line 111 to the coupler 112. The signal fed to the coupler 112 is called a main amplification signal including distortion components caused during the amplification by the main amplifier 104.

The second signal thus distributed by the distributor 102 is delayed through the delay line 106 by a delay time equivalent to that of the vector adjuster 108 and main amplifier 104 to be fed to the coupler 108. On the other hand, a portion of the main amplification signal is branched by the coupler 7 to be supplied to the coupler 108 in an inverse-phase state. These signals are mixed with each other by the coupler 108 to be supplied to the coupler 110. The pilot signal contained in the portion of the signal branched by the coupler 110 is detected by the detector 122 to be inputted to the controller 109. The control circuit 109 adjusts attenuation and phase shift of the vector adjuster 108 to minimize the output signal level of the detector 122.

In the construction, the output terminal of the distributor 102 is linked with the coupler 108 only by the delay line 106 and hence distortion generated by the line 106 is negligible. Consequently, if the sensor loop A is appropriately operating, the portion of the input signal passed through and amplified by the vector adjuster 108 and main amplifier 104 is coupled by the coupler 108 with the first signal in an inverse-phase state. Resultantly, only the distortion component generated or mixed in the main amplifier 104 are outputted from the coupler 108.

The distortion component signal fed from the coupler 108 to the coupler 110 is then delivered to the vector adjuster 118 for adjustment of attenuation and phase shift thereof. The obtained signal is then supplied to and amplified by the auxiliary amplifier 115. The amplified distortion component is the mixed by the coupler 112 in the reverse-phase state with the main amplification signal delayed through the delay line 111 by a propagation delay time of the vector adjuster 113 and auxiliary amplifier 115.

The composite signal is then supplied to the coupler 116 such that a portion thereof is branched to the detector 128. The detector 123 conducts, for example, a simultaneous detection for the inputted composite signal to extract therefrom a pilot signal and then sends the pilot signal to the control circuit 114. The controller 114 regulates attenuation and phase shift of the vector adjuster 118 to set the output level of the detector 128 to a minimum value. As a result, in the main amplification signal sent from the coupler 116 to the output terminal 117, the pilot signal takes the minimum value, namely, the distortion component is minimized.

The signal fed to the input terminal 101 is subjected to modulation due to information transmission and may possibly continually interrupted in some cases. Consequently, when the input signal is adopted to control amplification, the amplified signal becomes unstable. However, according to the conventional linear (feedforward) amplifier configured as above, since amplification is supervised by a pilot signal of which the level and frequency are determined, there can be attained a stable amplification signal.

However, in the linear amplifier of the prior art, to obtain compression of, for example, at least 30 decibel (dB) in a frequency band, it has been known in computation that the deviations respectively of amplitude and phase are required to be within ±0.3 dB and ±2°, respectively. These values indicate deviations respectively thereof related to the frequency used and the frequency of the pilot signal when the pilot signal is completely canceled. Consequently, in the conventional amplifier, a stable control operation is expected in the neighborhood of the frequency of the pilot signal. However, to remove the 30 dB distortion uniformly in any zone of a frequency band, the constituent elements of the loops included in the main and auxiliary amplifiers 104 and 115 are required to have severe frequency characteristics, namely, the deviations respectively of amplitude and phase are required to be within ±0.3 dB and ±2°, respectively.

In consequence, the linear amplifier of the prior art is attended with a problem that the amplifier is unsuitable for amplification of signals in a wide-band.

SUMMARY OF THE INVENTION

It is therefore an object of the present invention to provide a linear amplifier capable of producing a stable amplification signal with a compressed distortion in a wide band.

In accordance with the present invention, there is provided a feedforward amplifier including a main amplifier circuit including first equalizing means for adjusting frequency characteristics of amplitude and phase of an input signal thereto and first amplifying means for amplifying the input signal, the first equalizing means and the first amplifying means being arranged in a cascade connection, the main amplifier circuit producing therefrom an amplification signal by amplifying the input signal; an auxiliary amplifier circuit including distortion sensing means for branching a portion of the amplification signal, mixing the signal portion with the input signal, and sensing a distortion signal appearing in the amplification signal, second equalizing means for adjusting frequency characteristics of amplitude and phase of the distortion signal, and second amplifying means for amplifying the distortion signal sensed by the sensing means; the distortion sensing means, the second equalizing means, and the second amplifying means being disposed in a cascade connection, the auxiliary amplifying means outputting the amplified distortion signal therefrom; and distortion removing means for removing the distortion signal according to the amplification signal and the amplified distortion signal.

A feedforward amplifier in accordance with the present invention includes oscillator means for generating an oscillation signal having a predetermined frequency, first coupling means for superimposing the oscillation signal onto an input signal thereto and outputting a superimposed signal, distributor means for distributing the superimposed signal as a first signal and a second signal respectively to two destinations, equalizing means for adjusting frequency characteristics of amplitude and phase of the first signal, amplifying means for amplifying an output signal from the equalizing means, second coupling means for coupling the second signal in a reverse-phase state with an output signal from the amplifying means, sensing means for sensing in an output signal from the second coupling means the oscillation signal superimposed by the first coupling means, and control means for adjusting frequency characteristics of amplitude and phase of the equalizing means according to a sense signal sensed by the sensing means.

A feedforward amplifier in accordance with the present invention first oscillator means for generating a first oscillation signal having a predetermined frequency, first coupling means for superimposing the first oscillation signal onto an input signal thereto and outputting a superimposed signal, distributor means for distributing the superimposed signal as a first signal and a second signal respectively to two destinations, first equalizing means for adjusting frequency characteristics of amplitude and phase of the first signal, first amplifying means for amplifying an output signal from the first equalizing means, second oscillator means for generating a second oscillation signal having a predetermined frequency, second coupling means for coupling the second signal with an output signal from the first amplifying means, thereby producing a superimposed amplification signal, third coupling means for branching and extracting a portion of an output signal from the second coupling means, fourth coupling means for coupling an output signal from the third coupling means in a reverse-phase state with the second signal distributed by the distributor means, second equalizing means for adjusting frequency characteristics of amplitude and phase of an output signal from the fourth coupling means, second amplifying means for amplifying an output signal from the second equalizer means, fifth coupling means for coupling an output signal from the second coupling means in a reverse-phase state with the superimposed amplification signal, first sensing means for sensing from an output signal from the fourth coupling means the first oscillation signal superimposed by the first coupling means, first control means for adjusting frequency characteristics of amplitude and phase of the first equalizer means according to a sense signal sensed by the first sensing means, second sensing means for sensing from an output signal from the fifth coupling means the second oscillation signal superimposed by the second coupling means, and second control means for adjusting frequency characteristics of amplitude and phase of the second equalizing means according to a sense signal sensed by the second sensing means.

A feedforward amplifier in accordance with the present invention further includes first delay means between the third and fifth coupling means, the first delay means (having a delay time) equivalent to a time constant of signal delay of the second equalizer means and the second amplifying means and second delay means at an upstream position preceding the fourth coupling means, the second delay means (having a delay time) equivalent to a time constant of signal delay of the first equalizer means and the first amplifying means.

In accordance with the feedforward amplifier of the present invention, the frequency characteristics of the amplitude and phase of the input signal are adjusted and amplified to obtain an amplification signal. A portion of the signal is used as an input signal to be mixed with the input signal so as to generate a composite signal, thereby detecting a distortion signal caused in the amplification signal. The frequency characteristics of the amplitude and phase of the detected distortion signal are adjusted and amplified to attain an amplified distortion signal. Consequently, the distortion signal appearing in the amplification signal can be removed by the distortion removing means according to the amplified distortion signal.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Referring now to the accompanying drawings, description will be given in detail of an embodiment of the feedforward amplifier in accordance with the present invention. FIGS. 2 to 5 show an embodiment of the feedforward amplifier in accordance with the present invention.

Circuit configuration

Figure 1:
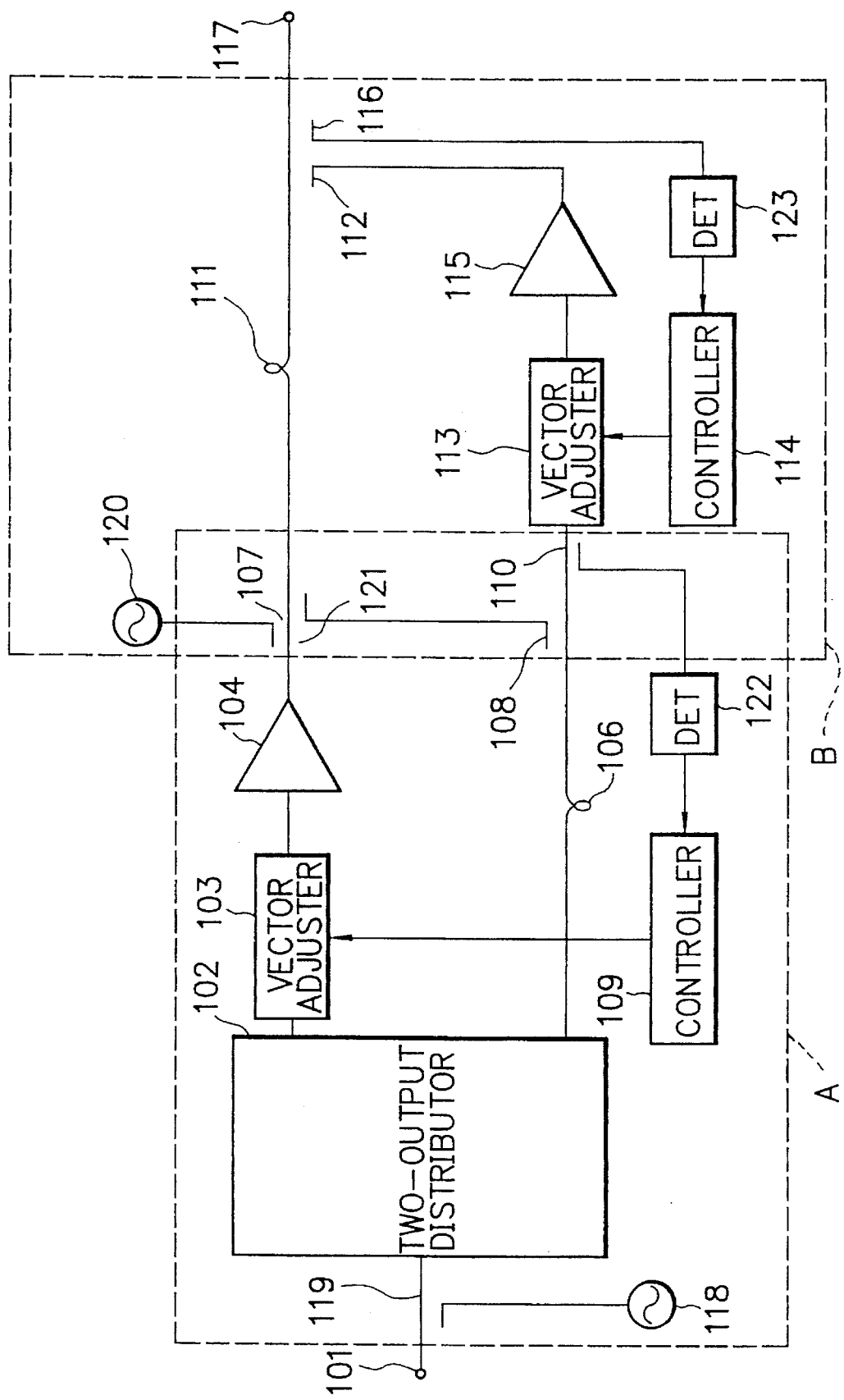
FIG. 1 is a schematic diagram showing an example of the circuit configuration of a conventional feedforward amplifier.
Figure 2:
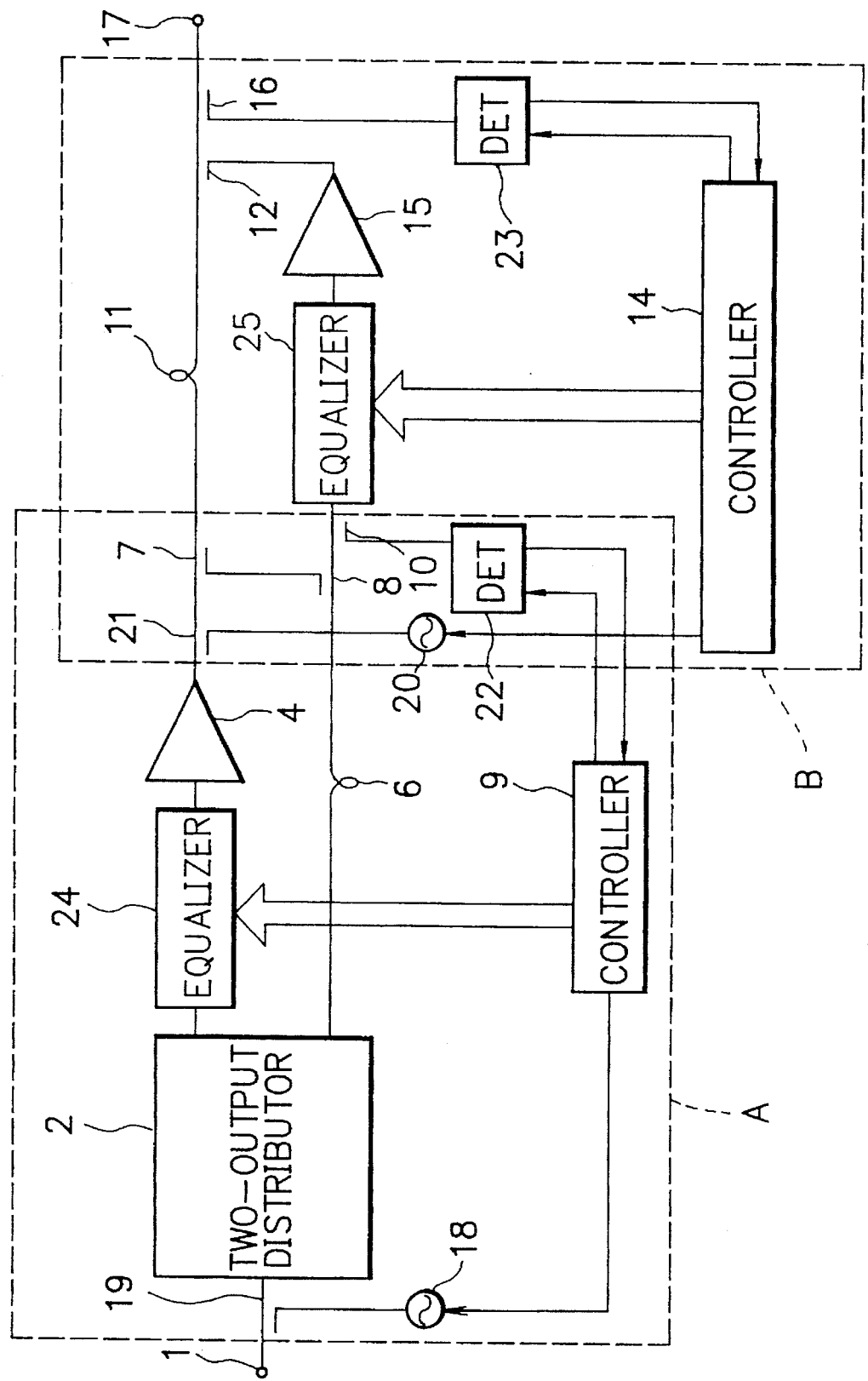
FIG. 2 is a diagram showing the circuit configuration of a feedforward amplifier in accordance with the present invention.

FIG. 2 shows the circuit construction of the embodiment in accordance with present invention. The feedforward amplifier includes common elements with the conventional feedforward amplifier. That is, the amplifier includes a distortion sensing loop A in which a multiplex signal containing multiple frequencies in a high-frequency band is received via the input terminal 1 to be simultaneously amplified and inputted signal components are cancelled to sense non-linear distortion components caused during amplification and a distortion removing loop B in which the sensed distortion components are amplified by the auxiliary amplifier 15 to be again added to an output signal from the main amplifier 4 so as to cancel the distortion components.

The distortion sensor loop A includes a coupler 19, a pilot oscillator 18, a two-output distributor 2, an equalizer 24 for regulating frequency characteristics of attenuation and delay, a main amplifier 4, a delay line 6, and a control circuit 9. In addition, (bi-directional) couplers 7 and 8 are arranged therein to be commonly used also by the distortion remover loop B.

The pilot oscillator 18 is an oscillator which generates and outputs therefrom a signal having a predetermined frequency. The oscillation frequency is supervised by a control signal from the controller 9. The coupler 19 mixes the multiplex signal received via the input terminal 1 with the output signal from the pilot oscillator 18. The distributor 2 distributes an output signal from the coupler 19 to two destinations.

Figure 3:
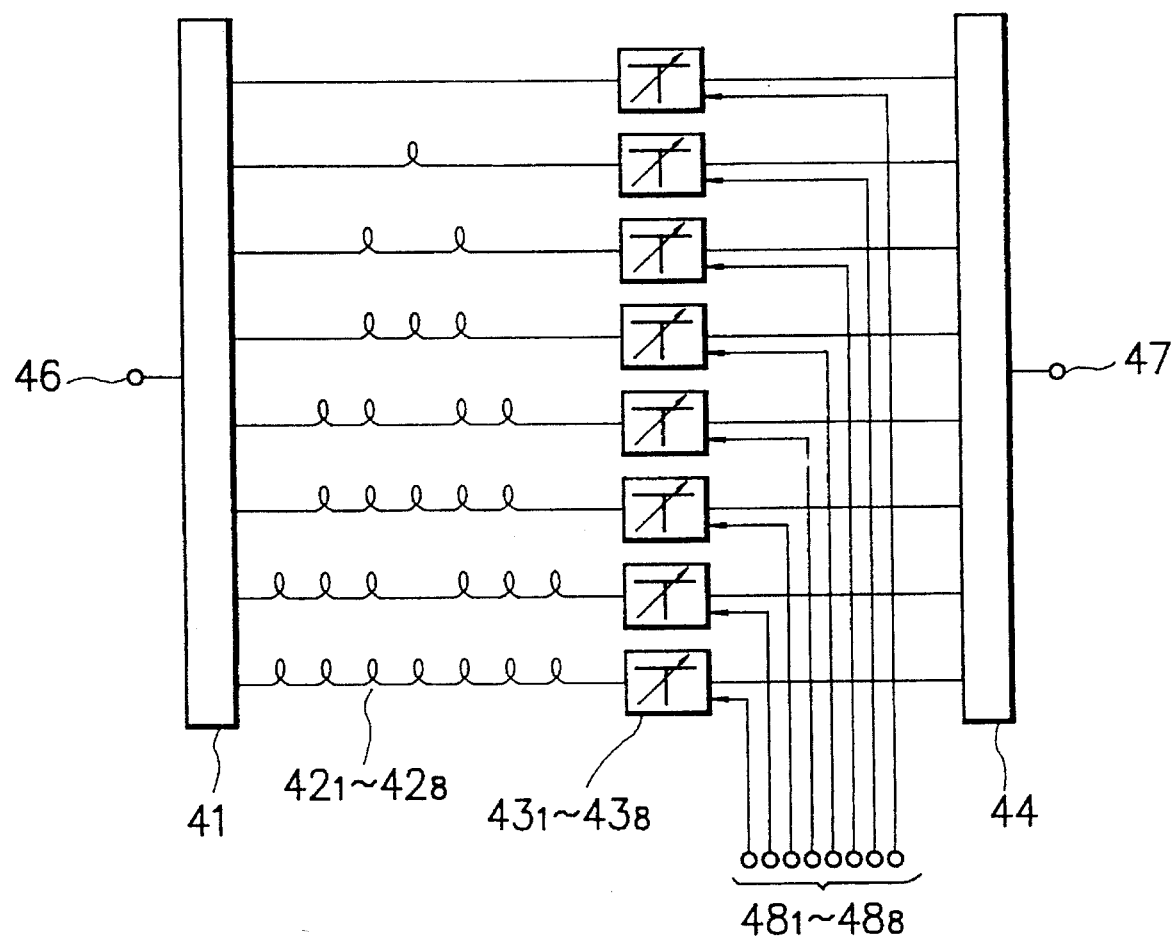
FIG. 3 is a diagram schematically showing the circuit configuration of a first embodiment of an equalizer constituting the feedforward amplifier of FIG. 2.
Figure 4:
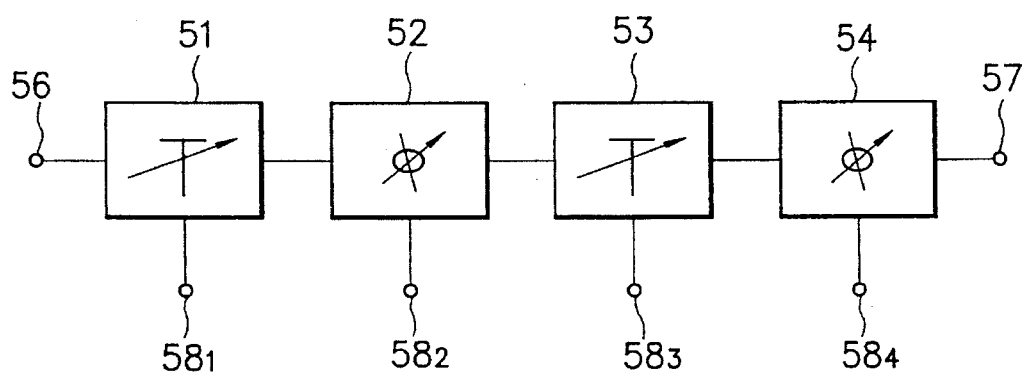
FIG. 4 is a diagram showing the circuit configuration of a second embodiment of the equalizer in the feedforward amplifier of FIG. 2.

The equalizer 24 adjusts frequency characteristics of attenuation and phase shift of a first signal distributed from the distributor 2 according to an output signal from the control circuit 9. Examples of constitution of the equalizer 24 are shown in FIGS. 3 and 4. The contents thereof will be described later in this specification.

In the equalizers 24a and 24b respectively shown in FIGS. 3 and 4, signal components of signals supplied to input terminals 46 and 56 are significantly regulated according to magnitude of a control voltage applied to control signal input terminals $48_1$–$48_8$ and $58_1$–$58_4$, thereby delivering regulated signals to output terminals 47 and 58.

The main amplifier 4 amplifies a signal outputted from the equalizer 24. The controller 9 receives as an input thereto an output signal from the detector 22 to output control signals respectively to the pilot oscillator 18 and equalizer 24.

The coupler 21 shared between the sensing and removing loops A and B superimposes the pilot signal from the pilot oscillator 20 onto an output signal from the main amplifier 4. Each of the couplers 7 and 10 branches and extracts a portion of a signal inputted thereto, whereas the coupler 8 mixes the signal branched by the coupler 7 in an inverse-phase state. The detector (DET) 22 separates and extracts the pilot signal from the signal branched by the coupler 10.

The distortion remover loop B includes a delay line 11 for delaying a signal, couplers 12 and 16 for separating and/or coupling signals, an equalizer 25, a control circuit 14 for supervising the pilot oscillator 20 and equalizer 25, an auxiliary amplifier 15, a detector 28, and the common couplers 7, 8, 10 and 21, the pilot oscillator 20, and the detector 22 also used by the distortion sensor loop.

FIG. 3 shows a first constitution example of the equalizer 24. In the equalizer 24a of FIG. 3, between output terminals of an 8-output distributor 41 and input terminals of an 8-input mixer 44, delay lines 421 to 428 and variable attenuators 431 to 438 are respectively connected in series. The distributor 41 has an input section connected to the input terminal 46, whereas the mixer 44 possesses an output section linked with the output terminal 47. The attenuators 431 to 438 respectively include control signal sections respectively coupled with the control signal input terminals 481 to 488.

The 8-output distributor 41 receives one signal via the input terminal to distribute the signal to eight output ports. The delay line 42 includes delay lines 421 to 428 respectively having mutually different time constants. The variable attenuators 431 to 438 respectively receive input signals respectively through the delay lines 421 to 428 to produce therefrom signals attenuated respectively according to control signals from the control signal input terminals 481 to 488. The 8-input mixer mixes eight output signals from the attenuators 421 to 428 into one mixed signal to be outputted to the output terminal 47.

FIG. 4 shows an example of constitution of the second embodiment of the equalizer 24. In the configuration of the equalizer 24b of FIG. 4, a variable attenuator 51 dominant in a high-frequency range, a variable phase shifter 52 dominant in a high-frequency range, a variable attenuator 53 dominant in a low-frequency range, and a variable phase shifter 54 dominant in a low-frequency range are arranged in a cascade connection.

Figure 5:
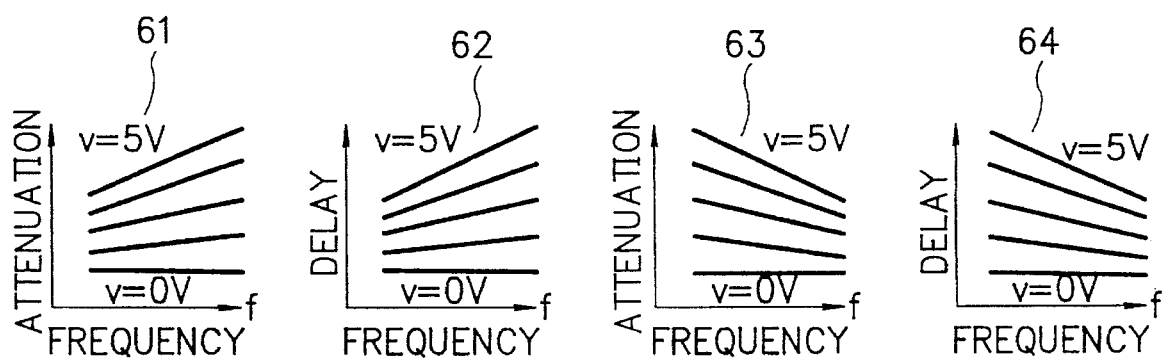
FIG. 5 is a graph showing an example of frequency characteristics of components constituting the equalizer of FIG. 4.

FIG. 5 shows characteristics of constituent components of the equalizer 24b of FIG. 4. Graphs 61 to 64 shown in FIG. 5 represent examples of characteristics in which control signals applied to the control signal input terminals 581 to 584 are employed as parameters.

A multiplex signal including many frequencies in a high-frequency band is supplied to the input terminal 1 to be then mixed by the coupler 19 with an output signal from the pilot oscillator 18. The mixed signal is distributed as a two signals including a first signal and a second signal from the distributor 2. The first signal is fed to the equalizer 24 to be subjected to adjustment of attenuation and phase shift thereof and then the obtained signal is supplied to and amplified by the main amplifier 4. The amplified signal is superimposed by the coupler 21 onto a pilot signal created from the pilot oscillator 20 to be delivered via the coupler 7 and delay line 11 to the coupler 12. The input signal to the coupler 12 is the main amplification signal containing distortion components caused during amplification in the main amplifier 4.

The second signal from the distributor 2 is delayed through the delay line 6 by a delay time equivalent to the signal delay time related to the equalizer 24 and main amplifier 4. The obtained signal is coupled in the reverse-phase state by the coupler 8 with a portion of the main amplification signal branched by the coupler 7. The composite signal is delivered to the coupler 10. A portion of the input signal is branched by the coupler 10 to the detector 22. The pilot signal contained in the input signal is detected therein and is then fed to the control circuit 9. The controller 9 accordingly regulates the equalizer 24 to set the output signal level of the detector 22 to a minimum value.

The output terminal of the distributor 2 is linked with the coupler 8 only by the delay line 6. Logically, there does not exist any element causing distortion. In consequence, if the operation of the sensor loop A is appropriate, only the distortion components mixed with or generated in the input signal when the input signal is passed through and amplified by the equalizer 24 and main amplifier 4 (primarily caused by the main amplifier 4) are supplied from the coupler 8 to the coupler 10.

The distortion components fed to the coupler 10 undergo adjustment of frequency characteristics of attenuation and phase shift by the equalizer 25. The adjusted signal is inputted and amplified by the auxiliary amplifier 15 to be outputted the coupler 12. The output signal from the auxiliary amplifier 15 is coupled by the coupler 12 with the main amplification signal delayed through the delay line 11 by a delay time of the equalizer 25 and auxiliary amplifier 15. The composite signal is fed to the coupler 16 such that a portion thereof is branched to the detector 23. The detected signal is then inputted to the control circuit 14.

The detector 23 carries out, for example, a synchronous detection to extract the pilot signal from the input signal and then delivers the pilot signal to the controller 14. The control circuit 14 supervises characteristics of the equalizer 25 so as to set the output level of the detector to a minimum value. Resultantly, the output terminal 17 is supplied with a main amplification signal in which the pilot signal is minimized, namely, the distortion components take a minimum value.

Figure 6:
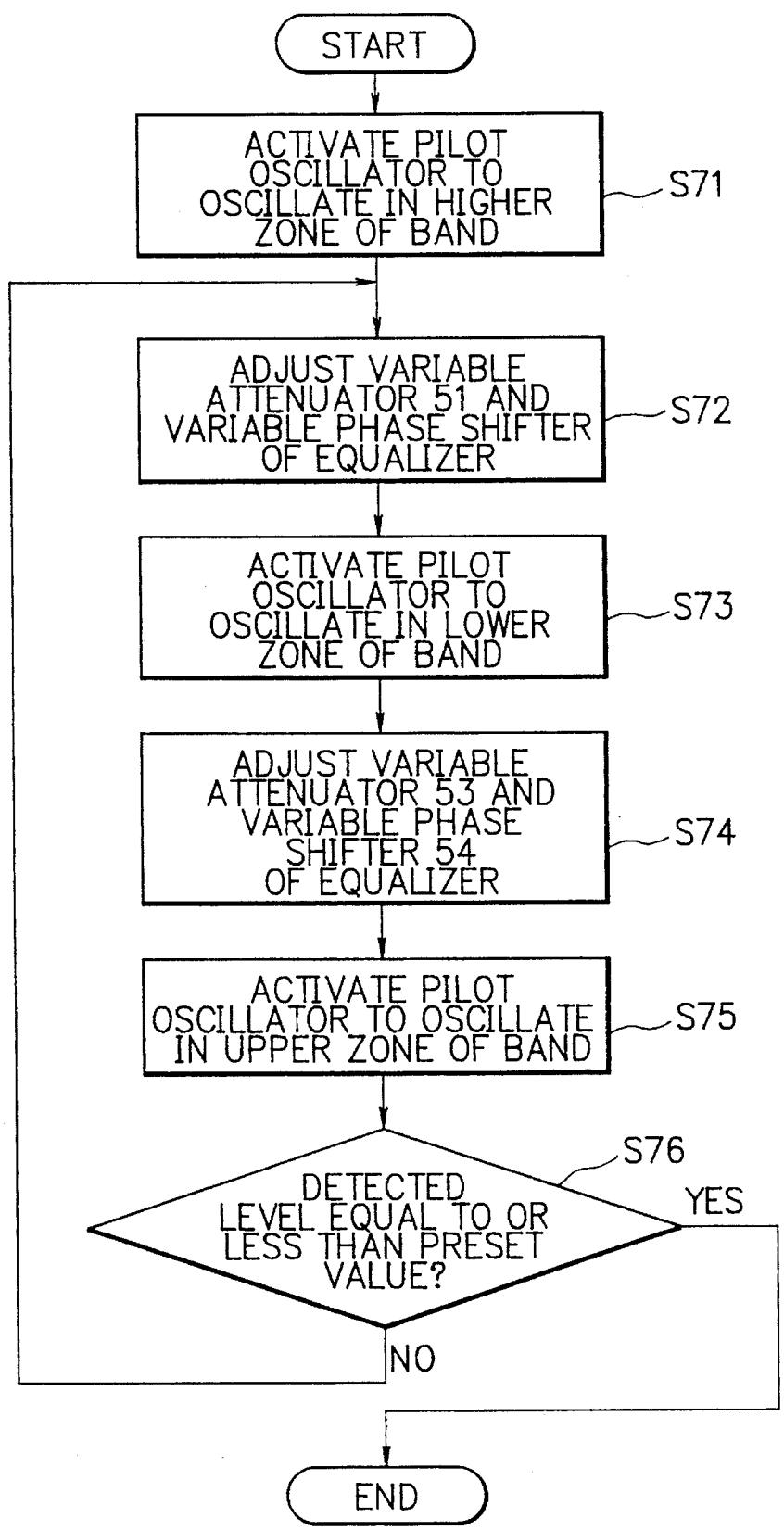
FIG. 6 is a flowchart showing an example of the adjusting procedure of the equalizer shown in FIG. 4.

Referring now to the flowchart of FIG. 6, description will be given of the adjusting procedures employed by the sensor and remover loops A and B. In this connection, the equalizer 24b of the second embodiment shown in FIG. 4 will be used as the equalizers 24 and 25.

In step S71, the pilot oscillators 18 and 20 are activated to oscillate in upper ranges of respective frequency bands. In step S72, the variable attenuator 51 and variable phase shifter 52 of the equalizers 24 and 25 are adjusted.

In step S73, the pilot oscillators 18 and 20 are caused to oscillate in lower zones of respective frequency bands. In step S72, the variable attenuator 53 and variable phase shifter 54 of the equalizers 24 and 25 are regulated.

In step S76, a check is made to decide whether or not the detected level exceeds the preset value. If the level exceeds the value (NO is the flowchart), control is returned to step S72 to repeatedly execute the subsequent steps up to step S76: otherwise, the adjusting procedure is terminated.

As described above, the equalizer 24b shown in FIG. 4 includes a cascade connection of a variable attenuator 51 and a variable phase shifter 52 which are dominant in a high-frequency range and a variable attenuator 53 and a variable phase shifter 54 which are dominant in a low-frequency range. Consequently, according to the procedures above, the variable attenuators and phase shifters having dominant characteristics in the respective frequency bands can be repeatedly adjusted by sequentially changing the frequency of the pilot signal, thereby obtaining desired characteristics. In this operation, oscillation frequencies of the pilot oscillators 18 and 20 are required to be different from that of the high-frequency signal supplied to the input terminal 1.

In addition, when the equalizer 24a is employed as the equalizers 24 and 25, there can be used the ZF method and the least-mean-square (LMS) method which are used to control transversal filters.

In addition to the control operation achieved by altering oscillation frequencies of the pilot oscillators 18 and 20, there may be conducted a similar control operation by expanding the frequency band of the pilot signal through achieving a spectrum diffusion modulation for the pilot signal.

According to the embodiment above, the vector adjuster conventionally adopted to regulate amplitude and phase is replaced with an equalizer capable of adjusting frequency characteristics of amplitude and phase so as to vary oscillation frequency characteristics of the pilot signal oscillator. Alternatively, a spectrum diffusion modulation is carried out for the pilot signal to advantageously configure a feedforward amplifier having an optimal operating point in the bands to be used.

Description has been given of an embodiment of the present invention only by way of example. However, the present invention is not restricted by the embodiment, namely, the embodiment can be changed or modified within the scope and spirit of the present invention.

As can be seen from the description above, when a signal is inputted to the feedforward amplifier in accordance with the present invention, frequency characteristics of amplitude and phase of the signal are adjusted and amplified to produce an amplification signal. A portion thereof is branched such that a distortion signal is detected from the branched signal. Frequency characteristics of amplitude and phase of the distortion signal are adjusted and amplified to attain an amplified distortion signal. Since a distortion signal caused in the amplification signal is removed according to the amplified distortion signal, there can be produced a multiplex amplification signal containing multiple frequencies.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A feedforward amplifier, comprising:

a main amplifier circuit including:

a first equalizing means for adjusting frequency characteristics of both amplitude and phase of an input signal to provide a first adjusted signal; and a first amplifying means for amplifying the first adjusted signal to provide a first amplified signal;

the first equalizing means and the first amplifying means being arranged in a cascade connection so that the output of the main amplifier circuit is the first amplified signal;

a first delay line for delaying the input signal to provide a first delayed signal;

a second delay line for delaying the first amplified signal to provide a second delayed signal;

an auxiliary amplifier circuit including:

a distortion sensing means for synthesizing a branched signal of the first amplified signal with the first delayed signal to provide a distortion signal representative of a distortion of the first amplified signal;

a second equalizing means for adjusting frequency characteristics of both amplitude and phase of the distortion signal to provide a second adjusted signal; and a second amplifying means for amplifying the second adjusted signal to provide a second amplified signal;

the distortion sensing means, the second equalizing means and the second amplifying means being arranged in a cascade connection so that the output of the auxiliary amplifier circuit is the second amplified signal; and a distortion removing means for synthesizing the second amplified signal with the second delayed signal to remove said distortion from the second delayed signal.

2. A feedforward amplifier, comprising:

oscillator means for generating an oscillation signal with a controllable frequency;

first coupling means for superimposing the oscillation signal on an input signal to provide a superimposed signal;

distributor means for distributing the superimposed signal as a first distributed signal and a second distributed signal;

equalizing means for adjusting frequency characteristics of both amplitude and phase of the first distributed signal to provide an adjusted signal;

amplifying means for amplifying the adjusted signal to provide an amplified signal;

second coupling means for coupling the second distributed signal with a phase-reversed signal of the amplified signal to provide a coupled signal;

detecting means for detecting the oscillation signal, as it is contained in the coupled signal, to provide a detected signal; and control means responsible for the detected signal for controlling the equalizing means so that said frequency characteristics are controlled.

3. A feedforward amplifier in accordance with claim 2, wherein the control means controls the oscillator means so that said controllable frequency is controlled dependent on the detected signal.

4. A feedforward amplifier, comprising:

first oscillator means for generating a first oscillation signal with a controllable first frequency;

first coupling means for superimposing the first oscillation signal on an input signal to provide a first superimposed signal;

distributor means for distributing the first superimposed signal as a first distributed signal and a second distributed signal;

first equalizing means for adjusting first frequency characteristics of both amplitude and phase of the first distributed signal to provide a first adjusted signal;

first amplifying means for amplifying the first adjusted signal to provide a first amplified signal;

second oscillator means for generating a second oscillation signal with a controllable second frequency;

second coupling means for superimposing the second oscillation signal on the first amplified signal to provide a second superimposed signal;

third coupling means for branching the second superimposed signal to provide an extracted signal;

fourth coupling means for coupling a phase-reversed signal of the extracted signal with the second distributed signal to provide a first coupled signal;

second equalizing means for adjusting second frequency characteristics of both amplitude and phase of the first coupled signal to provide a second adjusted signal;

second amplifying means for amplifying the second adjusted signal to provide a second amplified signal;

fifth coupling means for coupling a phase-reversed signal of the second amplified signal with the second superimposed signal to provide a second coupled signal;

first detecting means for detecting the first oscillation signal, as it is contained in the first coupled signal, to provide a first detected signal;

first control means responsible for the first detected signal to control the first equalizing means so that said first frequency characteristics are controlled;

second detecting means for detecting the second oscillation signal, as it is contained in the second coupled signal, to provide a second detected signal; and second control means responsible for the second detected signal to control the second equalizing means so that said second frequency characteristics are controlled.

5. A feedforward amplifier in accordance with claim 4 further comprising:

first delay means connected between the third and fifth coupling means, the first delay means equivalent to a sum of signal delays at the second equalizing means and the second amplifying means; and second delay means coupled upstream of the fourth coupling means for delaying the second distributed signal, the second delay means equivalent to a sum of signal delays at the first equalizing means and the first amplifying means.

6. A feedforward amplifier in accordance with claim 4 wherein:

the first control means controls the first oscillator means so that said first controllable frequency is controlled in dependence on the first detected signal; and the second control means controls the second oscillator means so that said second controllable frequency is controlled in dependence on the second detected signal.

* * * * *